United States Patent [19]

Kwei

[11] Patent Number: 5,904,797
[45] Date of Patent: May 18, 1999

[54] ADHESION IMPROVEMENT WITH METHYLACRYLATE-CHROMIUM COMPLEXES AND POLY(VINYL ALCOHOL)

[75] Inventor: Joseph Zen-Hwa Kwei, Cleveland, Ohio

[73] Assignee: E. I. du Pont de Nemours and Company, Wilmington, Del.

[21] Appl. No.: 08/898,626

[22] Filed: Jul. 22, 1997

Related U.S. Application Data

[63] Continuation of application No. 08/599,826, Feb. 12, 1996, abandoned.

[51] Int. Cl.⁶ ........................................ C09J 5/02
[52] U.S. Cl. ........................ 156/307.3; 156/307.7; 156/326; 427/208; 526/56; 526/61
[58] Field of Search ........................ 427/208, 208.2, 427/208.4, 369, 370; 156/307.3, 307.5, 307.7, 326; 525/56, 61

[56] References Cited

U.S. PATENT DOCUMENTS

| | | | |
|---|---|---|---|
| 2,273,040 | 2/1942 | Iler . | |
| 2,544,666 | 3/1951 | Goebel et al. . | |
| 2,544,668 | 3/1951 | Goebel et al. . | |
| 3,311,528 | 3/1967 | Marzocchi | 161/193 |
| 3,454,515 | 7/1969 | Hathwar . | |
| 3,547,666 | 12/1970 | Louden | 106/171 |
| 3,585,103 | 6/1971 | Thomson | 161/191 |
| 3,655,353 | 4/1972 | Nalley et al. | 65/3 |
| 3,673,025 | 6/1972 | Fukuyama et al. | 156/154 |
| 3,705,183 | 12/1972 | Bunger et al. | 260/438.5 |
| 3,713,798 | 1/1973 | Stilley et al. | 65/106 |
| 3,725,448 | 4/1973 | West | 260/438.5 |
| 3,738,862 | 6/1973 | Klarquist et al. . | |
| 3,775,455 | 11/1973 | Cumbo | 260/438.5 |
| 3,787,326 | 1/1974 | Deyrup | 260/438.5 |
| 3,804,802 | 4/1974 | Bergna | 260/42.16 |
| 3,843,699 | 10/1974 | West | 260/438.5 |
| 3,900,689 | 8/1975 | Deyrup | 428/432 |
| 3,914,499 | 10/1975 | Siefert | 428/292 |
| 3,997,486 | 12/1976 | Moore, Jr. et al. | 260/23 |
| 4,027,071 | 5/1977 | Motsinger et al. | 428/392 |
| 4,263,082 | 4/1981 | Temple | 156/309.3 |

FOREIGN PATENT DOCUMENTS

| | | |
|---|---|---|
| 1067230 | 11/1979 | Canada . |
| 275541 | 7/1988 | European Pat. Off. . |
| 1161097 | 8/1969 | United Kingdom . |
| 1342910 | 1/1974 | United Kingdom . |

OTHER PUBLICATIONS

Abstract of SU 442194, Sep. 1974.
Abstract of JP 62–155976, Jul. 1987.
Abstract of CN 87 106022, Apr. 1988.
Abstract of CS 192094, Dec. 1982.
Translation of SU 442194, May 1974.
Translation of CS 192094, Nov. 1978.
Translation of JP 62–155976, Jul. 1987.

*Primary Examiner*—Erma Cameron

[57] ABSTRACT

A process for adhering hydrophilic surfaces and thermoset resin surfaces comprising coating the hydrophilic surface with an aqueous solution containing methylacrylato-chromium complex and poly(vinyl alcohol) is disclosed.

7 Claims, No Drawings

ADHESION IMPROVEMENT WITH METHYLACRYLATE-CHROMIUM COMPLEXES AND POLY(VINYL ALCOHOL)

This is a continuation of application Ser. No. 08/599,826 filed Feb. 12, 1996, now abandoned.

BACKGROUND OF THE INVENTION

Many processes for bonding of hydrophilic surfaces to free radical curing thermoset resins are known, for instance copper conductors to rubber insulation, but modern industries need further improvement in adhesion. To follow the copper/rubber example, the wire and cable industry needs further improvements in such adhesion. One known method for adhesion between copper and rubber is the use of resins or other thermoplastics to produce a tie coat between the insulation and the copper. It is also known to treat copper surfaces with methylacrylato-chromium complexes (e.g., chromium, aqua chloro hydroxy methacrylate complexes) before adhesion to rubber.

In the practice of prior art processes less than the theoretical maximum bond strength is developed. One cause for this deficiency is that wetting of a hydrophilic surface, for instance, a metal surface, with the chromium complex solution can be incomplete and the tensile bond strength between the hydrophilic surfaces and thermoset resin therefore is less than desired for certain applications. While the wetting of surfaces can readily be improved by the use of a surfactant either as a prewash or as a component of the chromium complex solution, when sufficient surfactant is present to effect more complete wetting, surfactants are found to interfere with the bonding action of the chromium complex, probably by altering the surface polarity, causing disorientation of the chromium complex on the hydrophilic surface. Surfactants are thus relatively ineffective in this use.

It is desirable to have a process which provides hydrophilic surface to thermoset resin tensile bond strengths several times higher than achieved using known processes. An improved process is applicable in the wire and cable industry, as well as other industries, and is provided by the present invention.

SUMMARY OF THE INVENTION

The present invention comprises an improved process for adhering hydrophilic surfaces and thermoset resin surfaces wherein the improvement comprises coating the hydrophilic surface with an aqueous solution containing a methylacrylato-chromium complex and poly(vinyl alcohol) prior to contacting said metal surface with the thermoset resin surface, and curing the contacted surfaces. The solution is applied to the hydrophilic surface to provide a wet pickup of the solution of from about 0.9 to about 10.9 mg/cm$^2$. The solution contains from about 1% to about 10% by weight of chromium complex and from about 1% to about 10% by weight polyvinyl alcohol. Preferably the polyvinyl alcohol has a molecular weight of from about 7,000 to about 15,000 for maximum enhancement of the bonding.

DETAILED DESCRIPTION OF THE INVENTION

This invention is directed to a process for enhancing the adhesion between hydrophilic surfaces and the surface of thermoset resins that cure by a free radical process. Suitable hydrophilic surfaces for use herein include metals (such as copper, aluminum, zinc, iron, transition metals, and their alloys), glass, silica, fibers and polymeric surfaces or polymeric surfaces pretreated to become hydrophilic, such as by plasma or corona discharge. Suitable thermoset resins that cure by a free radical process for use herein include rubber, epoxy, polyester, vinyl, acrylic, and polyurethane resins. The process of the present invention comprises pretreating the hydrophilic surface with a aqueous solution containing both methylacrylato-chromium complexes and low molecular weight poly(vinyl alcohol), allowing the coating to dry, applying the thermoset resin coating, and curing the thermoset resin and bonding agent with heat.

Chromium (III) methacrylate surface active agents (chromium, aqua chloro hydroxy methacrylate complexes) are surface complexing monomers (Formula 1) which attach to inorganic, polar, or hydrophilic substrate surfaces as in Formula 2, oriented with the polymerizable group outward. The polymerizable group can subsequently be copolymerized during the free radical curing step for the thermoset resin, and thus be chemically incorporated into the thermoset resins. The cured thermoset resin is then chemically bonded to the substrate.

Formula 1

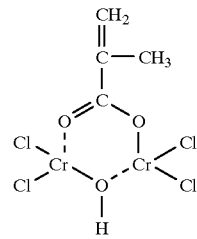

Formula 2

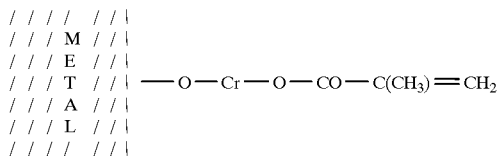

The use of low molecular weight solutions of poly(vinyl alcohol), hereinafter PVA, at specific concentration or wet pick up ranges causes a large and synergistic increase in both the tensile bond strength between the hydrophilic surface and thermoset resin and the uniformity of the tensile bond strength. Specifically, the process of this invention utilizes an aqueous solution containing from about 2% to about 10% by weight, and preferably from about 8.5% to about 10% by weight, of the active chromium complex ingredient. Alternatively when using a low-chloride version of the active chromium complex ingredient, the invention utilizes an aqueous solution containing from about 1% to about 10% by weight, and preferably from about 1% to about 3% by weight, of the active chromium complex ingredient. The process of the present invention uses from about 1% to about 10% by weight, and preferably from about 2% to about 4% by weight, of PVA having a molecular weight of 5,000 to 200,000, and preferably a molecular weight of from about 7,000 to about 15,000.

This solution is applied to the hydrophilic surface, for instance a copper surface, by dipping, spraying, or other application methods to provide a wet pick up of the solution of from about 0.9 to about 10.9 mg/cm$^2$ and preferably from about 5.5 to about 7.0 mg/cm$^2$. This corresponds to an amount of chromium on the surface between about 0.005 to about 0.06 mg/cm$^2$ and preferably between about 0.03 and about 0.04 mg/cm$^2$. The measurement of wet pick up is described in Application Method, below.

The solution is allowed to dry under ambient conditions or by forced or heated air, the uncured thermoset resin applied to the dried and treated hydrophilic surface, and the thermoset resin cured by heat under the appropriate thermoset resin curing conditions. Various curing methods are used to cure the thermoset resin. Such methods are well known to those skilled in the art, and include, for example, heated oven, microwave, electron beam, and catalytic methods.

Commercially available chromium (III) methacrylate complexes are available. For example, methylacrylato-chromium complexes such as "VOLAN" and "VOLAN" L Bonding Agents (a solution of chromium, aqua chloro hydroxy methacrylate complexes in isopropyl alcohol) are available from the E. I. DuPont de Nemours and Company, Wilmington Del. "VOLAN" L contains a lower chloride ion concentration, leaves less salts on the treated surface, and consequently is used at lower concentrations.

Low molecular weight poly(vinyl alcohol) (PVA) is commercially available. For example "AIRVOL" 103 and "AIRVOL" 203 poly(vinyl alcohol) are available from Air Products and Chemicals, Allentown Pa. and "ELVANOL" poly (vinyl alcohol) from the E. I. DuPont de Nemours and Company, Wilmington Del.

Thermoset resins are commercially available. For example "NORDEL" 1470 Hydrocarbon Rubber (ethylene-propylene hydrocarbon elastomer) is available from E. I. DuPont de Nemours and Company, Wilmington Del.

The surface treating solution is prepared by adding the desired amounts of the chromium (III) complex to a solution containing the desired concentration of PVA in water and mixing thoroughly.

Double-sided, copper-clad epoxy-glass laminated sheets were used to perform adhesion tests. Standard printed circuit board stock is available from Newark Electronics, Chicago Ill. The copper surface was used either as received (oxidized) or after burnishing with fine steel wool immediately before the adhesion tests (unoxidized).

Application Method

An aqueous solution containing 10% by weight "VOLAN" and 4% by weight "AIRVOL" 103 poly(vinyl alcohol) was prepared, coated evenly by dipping onto the laminated copper-clad, having dimensions of approximately 3 cm by 10 cm, and allowed to dry. Flat strips (0.5 cm by 10 cm, 0.5 cm thick) of NORDEL rubber compound were placed in the center of the copper surface and a pressure of 30 KPa (3,000 kg/m$^2$) was created by the application of weights to ensure even surface contact. While under pressure, the rubber/copper-clad laminate sandwich was heated at 206° C. for 10 minutes to cure the rubber compound. The composite was allowed to cool and the average tensile bond strength determined as described under Average Tensile Bond Strength Determination below.

The amount of the solution of the chromium complex applied to a surface is expressed as the wet pick up. The sample is weighed before and immediately after coating, before the coating dries. The difference, the weight of solution applied, is divided by the total wetted surface area of the sample. The wet pick up is expressed in mg/cm$^2$.

Average Tensile Bond Strength Determination

The tensile bond strength between the hydrophilic substrate and thermoset resin after curing is measured by inserting the sample metal-rubber composite in a tensile testing apparatus, such as a Keil Adhesion Testing Apparatus (Keil model 1, available from the Kalamazoo Paper Company, Richland Mich., or equivalent apparatus), and measuring the force required to remove the rubber layer. The tensile bond strength is measured according to the Technical Association of the Pulp and Paper Institute (TAPPI) Method UM502, with the following modifications for the materials used in this application:

1. The rubber strip is the adhesive layer to be peeled from the surface of the substrate (TAPPI Method UM502 peels off pressure-sensitive tape),
2. The substrate from which the rubber strip is peeled is the appropriate surfaced flat panel, i.e. copper, glass, etc. (TAPPI Method UM502 peels from paper or paperboard), and
3. Five measurements are made at 25 mm intervals along the strip being delaminated from the surface. The average value and standard deviation are calculated from these five measurements.

For the examples described below, the physical configuration of the metal and thermoset resin is a coating on a flat metal laminate plate. This specific configuration is chosen as it is suitable for subsequent measurement of the tensile bond strength between the metal and the thermoset resin.

The process of this invention is applicable to any configuration of metal substrate and thermoset resin. It is useful for adhering hydrophilic surfaces and thermoset resin surfaces in wire coatings, circuit boards, and other electrical and electronic assemblies and sub assemblies.

EXAMPLES

Example 1

Three aqueous solutions containing respectively 10% by weight VOLAN bonding agent, 4% by weight poly(vinyl alcohol), and 10% by weight VOLAN bonding agent plus 4% by weight poly(vinyl alcohol) were prepared and separately coated evenly onto 3 cm by 10 cm copper-clad laminated sheets as described previous and allowed to dry at ambient temperature.

The amount of solution applied was approximately 6.1 mg/cm$^2$ wet pickup, corresponding to chromium and PVA concentrations on the surface of approximately 0.2 mg/cm$^2$ and approximately 0.25 mg/cm$^2$, respectively.

Flat 0.5 cm by 10 cm strips of rubber compound, of thickness 0.5 cm, were placed on the copper surfaces and weights added to provide a uniform pressure of 0.3 Pa. While under pressure, the rubber/copper-clad laminate sandwich was heated in a curing oven at 206° C. for 15 minutes to cure the rubber compound. The composite was allowed to cool and the average tensile bond strength determined as in Average Tensile Bond Strength Determination (TAPPI Method UM502 with revisions) above. The bond strength measurements are shown in the Table 1.

Examples 2 and 3

Samples were prepared and tested according to the procedure of Example 1, except that in the case of Example 2, the 3 cm by 10 cm copper-clad laminated sheets were burnished immediately prior to treatment with fine steel wool to provide an unoxidized surface. The bond strength measurements are shown in Tables 2 and 3.

TABLES

TABLE 1

Average Tensile Bond Strengths - Oxidized* Copper Surface

| Example # | Example Description | Average Tensile Bond Strength g/cm | S.D. |
|---|---|---|---|
| 1 | Untreated oxidized copper | 105 | 22 |
| 1 | Treated with PVA only | 0 | 0 |
| 1 | 10% VOLAN, no PVA | 371 | 110 |
| 1 | 10% VOLAN, 4% PVA | 500 | 1 |

*Oxidized copper surface was as received.

TABLE 2

Average Tensile Bond Strengths - Unoxidized* Copper

| Example # | Example Description | Average Tensile Bond Strength g/cm | S.D. |
|---|---|---|---|
| 2 | Untreated unoxidized copper | 105 | 22 |
| 2 | Treated with PVA only | 0 | 0 |
| 2 | 10% VOLAN, no PVA | 143 | 63 |
| 2 | 10% VOLAN, 4% PVA | 500 | 1 |

*Copper surface burnished with fine steel wool immediately before treatment.

TABLE 3

Average Tensile Bond Strengths - Oxidized* Copper

| Example # | Example Description | Average Tensile Bond Strength g/cm | S.D. |
|---|---|---|---|
|   | Untreated oxidized copper control, see Table 1 |   |   |
| 3 | Copper treated with PVA only | 0 | 0 |
| 3 | 2% VOLAN L, no PVA | 212 | 44 |
| 3 | 2% VOLAN L, 4% PVA | 500 | 1 |

*Oxidized copper surface was as received.

What is claimed is:

1. An improved process for adhering hydrophilic surfaces and thermoset resin surfaces wherein the improvement comprises coating a hydrophilic surface selected from the group consisting of metal and polymeric surfaces with an aqueous solution containing a methacrylato-chromium complex and from about 1% to about 10% by weight of poly(vinyl alcohol) having a molecular weight of from about 5,000 to about 200,000 to provide a wet pick up of said solution of from about 0.9 to about 10.9 mg/cm$^2$ prior to contacting said hydrophilic surface with the thermoset resin surface, and curing the thermoset resin surface and the solution in contact with both surfaces.

2. The process of claim 1 wherein the solution contains from about 1% to about 10% by weight of chromium complex.

3. The process of claim 2 wherein the poly(vinyl alcohol) has a molecular weight of from about 7,000 to about 15,000.

4. The process of claim 1 wherein the metal is selected from the group consisting of copper, aluminum, zinc, iron, transition metals, and alloys thereof.

5. The process of claim 1 wherein the thermoset resin is selected from the group consisting of rubber, epoxy, polyester, vinyl, acrylic, and polyurethane.

6. The process of claim 1 wherein the chromium complex is of formula I

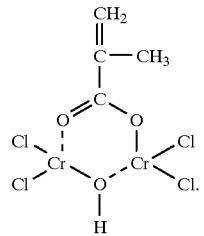

7. The process of claim 1 wherein the metal is copper and the thermoset resin is rubber.

* * * * *